(12) United States Patent
Park et al.

(10) Patent No.: US 6,238,774 B1
(45) Date of Patent: May 29, 2001

(54) PROTECTION OF OXIDE SUPERCONDUCTOR

(75) Inventors: Kyung-ho Park, Kawasaki; Nagisa Ohsako, Yokohama, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/261,246

(22) Filed: Jun. 14, 1994

Related U.S. Application Data

(63) Continuation of application No. 07/305,823, filed on Feb. 3, 1989, now abandoned.

(30) Foreign Application Priority Data

Feb. 4, 1988 (JP) .................................................. 63-22900
Apr. 27, 1988 (JP) ................................................ 63-105031

(51) Int. Cl.⁷ .............................. B32B 27/14; B32B 3/00
(52) U.S. Cl. ........................ 428/195; 428/209; 428/210; 428/688; 428/691; 428/930; 505/230; 505/231; 505/232; 505/233; 505/237; 505/238; 505/239
(58) Field of Search ................................... 428/209, 210, 428/688, 691, 930, 901; 505/701, 702, 703, 704, 230, 231, 232, 233, 237, 238, 239

(56) References Cited

U.S. PATENT DOCUMENTS 4,965,244 * 10/1990 Weaver et al. ......................... 427/62
4,980,339 * 12/1990 Setsune et al. ......................... 505/1
5,155,094 * 10/1992 Okabe et al. ........................... 505/1

OTHER PUBLICATIONS

Koinuma, Jap Journ. of Appl. Physics vol. 26, No. 5, 5–87 L763–765.*

Nakajima, Appl. Phys. Lett. 53(15) Oct. 10, 1988 pp. 1437–1439.*

Elliot, "Integrated Circuit Fabrication Technology", McGraw Hill 1982 p. 1.*

Doss, Engineer's Guide to High Tc Superconductivity Wiley & Sons 1989, pp. 105–108.*

Appl. Phys. Letts 53(11) 1004–1006, Meyer III et al. Sep. 12, 1988.*

CA 111(20):185839g, Seki, Oxide Ceramic Superconductor with Durability, Oct. 23, 1987.*

* cited by examiner

Primary Examiner—William Krynski
(74) Attorney, Agent, or Firm—Armstrong, Westerman, Hattori, McLeland & Naughton, LLP

(57) ABSTRACT

A high temperature oxide superconductor is efficiently protected from the affects of water and acids by forming a passivation layer of a fluoride. The fluoride layer comprises a fluoride composed of one or more elements composing the oxide superconductor and/or one or more elements that can compose an oxide superconductor by replacing at least in part one or more elements composing the oxide superconductor.

20 Claims, 2 Drawing Sheets

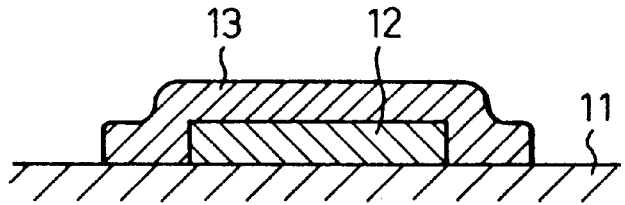
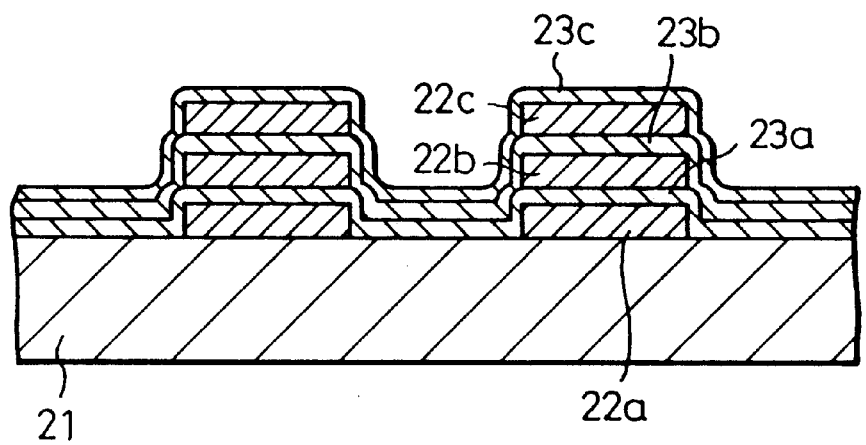
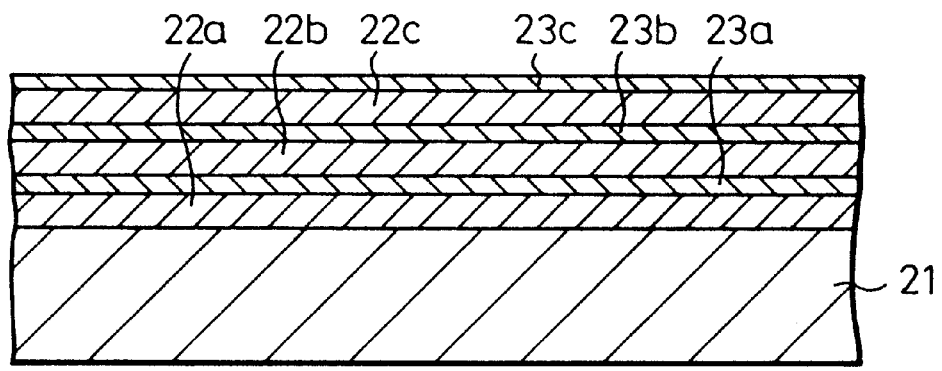

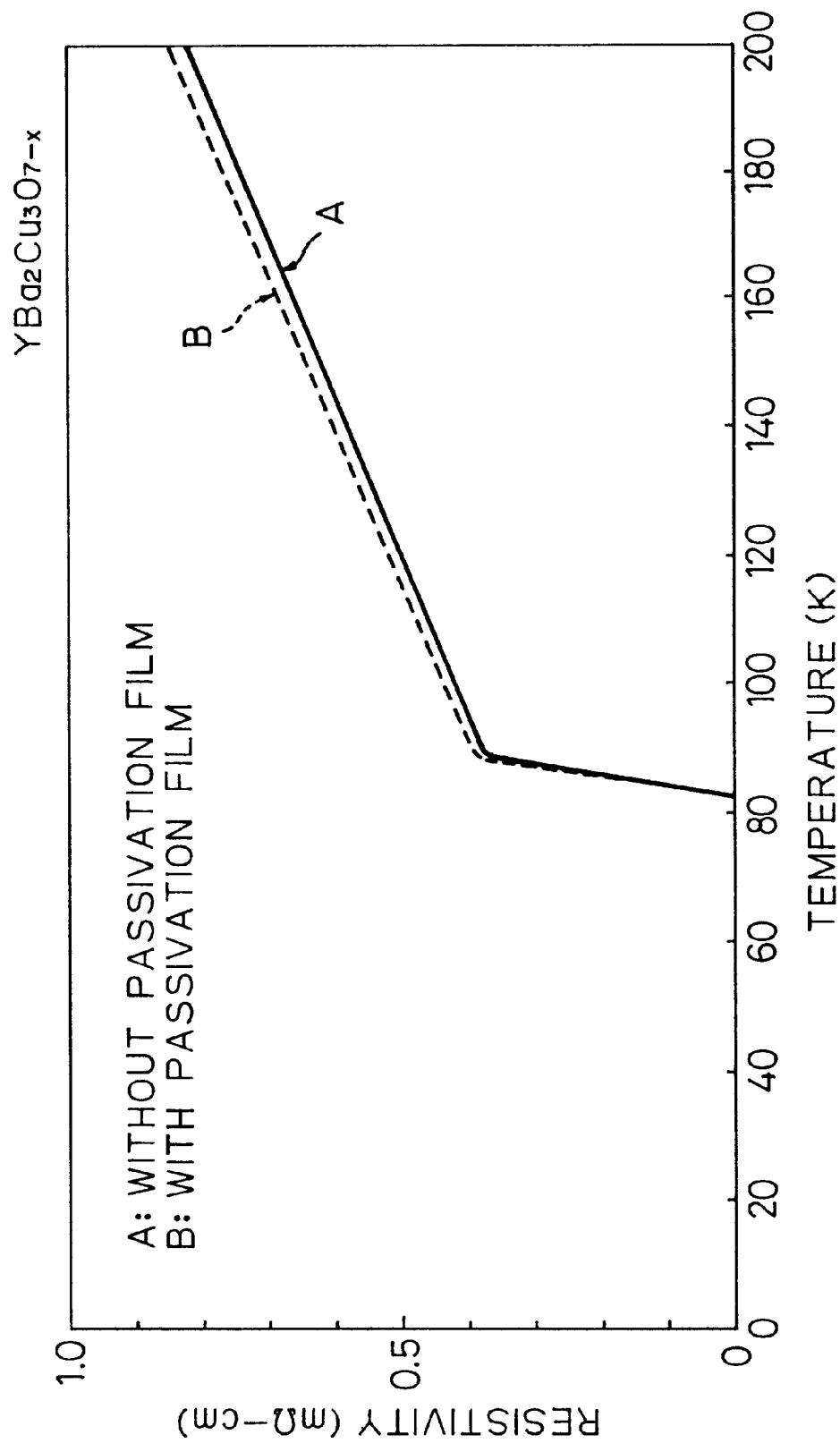

PROTECTION OF OXIDE SUPERCONDUCTOR

This application is a continuation of application Ser. No. 07/305,823 filed Feb. 3, 1989, now abandoned.

BACKGROUND OF THE INVENTION

1. Field of the Invention

The present invention relates to a protection of an oxide superconductor. This type of protection is particularly resistant to water and acids, and therefore, is useful for the protection of semiconductor devices using a superconductor wiring.

2. Description of the Related Art

High temperature superconductors have been developed which include [Y or La (lanthanoids)]-(Ba or Sr)—Cu—O system ($T_c$=90 K), Bi—Sr—Ca—Cu—O system ($T_c$=105 K), or Tl—Ba—Ca—Cu—O system ($T_c$=118 K) oxide superconductors. These superconductors have a high critical temperature, e.g., higher than the boiling point of liquid nitrogen, and have opened the way to a utilization of a superconductor for superconductor magnets, superconductor wiring, SQUID, etc.

The utilization of a superconductor necessitates a processing of the superconductor, per se, or a composite having the superconductor as a constituent component; particularly electronic devices, etc., containing a superconductor are processed with water or an acid such as nitric acid, chloric acid and fluoric acid for cleaning and patterning, etc. Oxide superconductors, however, are highly soluble in water or such acids, and thus may be damaged or the superconductive properties thereof degraded, during a process using water or an acid.

In practice, it has been found difficult to control the composition or structure of an oxide superconductor in an attempt to improve the resistance of the superconductor to water or acids, as superior superconductive properties can be obtained only in a limited composition and structure range. Accordingly, the utilization of an oxide superconductor is prevented due to the difficulty of processing the same.

The main object of the present invention is to provide an oxide superconductor which is protected from the affects of water and acids.

SUMMARY OF THE INVENTION

The above and other objects, features, and advantages are attained by an oxide superconductor covered with a layer of a fluoride composed of one or more elements, said elements of said fluoride being an element composing said oxide superconductor and/or an element that can compose an oxide superconductor by replacing, at least in part, an element composing said oxide superconductor.

The composition of this oxide superconductor is not particularly limited, and includes the following:

i) an R—Ba—Cu—O system, wherein R represents yttrium or lanthanoids, and ii) an R—Ca or Sr—Cu—O system, wherein R represents yttrium or lanthanoids.

BRIEF DESCRIPTION OF THE DRAWINGS

FIG. 1 is a sectional view of an oxide superconductor layer formed on a substrate and protected by a fluoride layer;

FIG. 2 shows the electrical resistance-temperature characteristics of the oxide superconductor before and after protection and immersion in water; and FIGS. 3A and 3B are sectional views of a protected wiring of an oxide superconductor in the form of multiple layers.

DESCRIPTION OF THE PREFERRED EMBODIMENTS

The present invention is advantageously applicable to R—Ba—Cu—O system superconductors, particularly $YBa_2Cu_3O_{7-\delta}$ ($0 \leq \delta \leq 1$).

The protective fluoride layer should comprise a fluoride composed of one or more elements which are one or more of the elements of an oxide superconductor to be protected and/or one or more of the elements that compose an oxide superconductor by replacing, at least in part, one or more elements composing the oxide superconductor. This fluoride layer is not only resistant to water and acids but also has a high adhesivity to and a high compatibility with an oxide superconductor, and as a result, the fluoride layer provides a good protection of an oxide superconductor.

The element(s) that compose(s) the fluoride with fluorine are preferably element(s) that compose(s) an oxide superconductor to be protected. For example, when an R—Ba—Cu—O system superconductor is to be protected, a fluoride of R, Ba and/or Cu, particularly R, is preferably used as the protective layer. Alternatively, the element(s) that compose(s) the fluoride with fluorine may be element(s) that do(es) not compose the oxide superconductor to be protected but form an oxide superconductor when replacing one or more elements constituting the oxide superconductor to be protected. For example, when one or more elements of yttrium and lanthanoids are contained in an oxide superconductor to be protected, a fluoride of one or more elements that is (are) yttrium or lanthanoids, but are not the element(s) contained in the oxide superconductor to be protected, can be used. The use of a protecting layer of such a fluoride ensures that, even if diffusion or a reaction occurs at the interface between the oxide superconductor and the fluoride, deviation of the chemical composition near the interface is kept to a minimum level and the property of the oxide superconductor is not damaged. Further, such a fluoride may be the same as or a similar material to the starting materials of an oxide superconductor, and may be formed by a process similar to that used for forming the oxide superconductor.

Most preferably, the oxide superconductor is $YBa_2Cu_3O_{7-\delta}$ and the protective layer is yttrium fluoride which is $YF_3$.

The fluoride protective layer may be formed by any conventional method, including sputtering, evaporation, and CVD, etc the fluoride layer has a thickness of 100 to 2000 Å.

The present invention is advantageously applicable to the protection of a layer of an oxide superconductor formed on a substrate; the layer of oxide superconductor including superconductive wiring. In this case, a fluoride layer is formed over a wiring pattern of an oxide superconductor layer on a substrate, so that the wiring pattern is covered or protected by the fluoride layer.

In a preferred embodiment, the superconductor wiring is composed of a plurality of layers of alternative an oxide superconductor and a fluoride as described above. This wiring structure is advantageous since, even if a one layer of an oxide superconductor is damaged because the protective fluoride layer covering that oxide superconductor layer is broken, the other oxide superconductor layers can still act as superconductor wiring, since the next fluoride layer still covers and protects the other superconductor layers. Further, this structure is also advantageous in that a layer of an oxide superconductor per se can be typically formed by a thin film-forming method.

The present invention will now be described in more detail by the following Examples, which in no way limit the invention.

EXAMPLE 1

An Y—Ba—Cu—O system superconductor film having a thickness of 5000 Å formed on a substrate about 1 mm×1 mm in size was completely dissolved in 0.5 ml of an aqueous solution of nitric acid (volume ratio of 61% nitric acid to water 1:1) in about 30 seconds by immersion. The same superconductor film as above was then immersed in 0.5 ml of an aqueous solution composed of nitric acid (61%), fluoric acid (50%) and water at a volume ratio of 4:1:5, and at least 30 minutes passed before the superconductor film was completely dissolved. By substituting part of the nitric acid with fluoric acid, the dissolving time was prolonged at least 60 fold and the resistance of the film to an acid (nitric acid) was remarkably improved. This was due to yttrium fluoride formed by a reaction between fluoride ions in the fluoric acid and yttrium in the Y-Ba—Cu—O superconductor.

Yttrium oxide ($Y_2O_3$) was used for evaluating the solubility of a reaction product of yttrium and fluorine.

Yttrium oxide powders were compressed to form pellets, which were immersed in 1 ml of a 1:1 aqueous solution of fluoric acid (50% fluoride acid plus water) for 2 minutes, followed by cleaning. The aqueous solution and the cleaning solution were combined, and the volume of the combined solution was determined before the intensity of emission from yttrium was observed by ICP emission spectrophotometry. The $Y_2O_3$ pellets were then again immersed in 0.1 ml of a 1:1 aqueous solution of fluoric acid for 2 minutes and IPC emission spectrophotometry was conducted to compare the amounts of dissolution in the first and second immersions. It was found that the amount of dissolution in the second immersion was less than half of that in the first immersion. This was due to yttrium fluoride formed on the surface of the pellets in the first immersion, which prevented dissolution of the pellets in the second immersion. However, in this evaluation, since the $Y_2O_3$ pellets used did not have dense grain boundaries, due to powder compression without a subsequent processing, the surfaces of the pellets were converted to yttrium fluoride but were not covered with an yttrium fluoride layer, and the fluoric acid penetrated the inner portion of the pellets and dissolved yttrium therefrom.

The above suggests that a fluoride according to the present invention provides a good protection of an oxide superconductor against water or acids.

EXAMPLE 2

This description is made with reference to FIG. 1. An oxide superconductor layer 12 of $YBa_2Cu_3O_{7-\delta}$ was deposited on a substrate 11, by RF magnetron sputtering, under the following conditions:

| | |
|---|---|
| Sputter gas: | $Ar + O_2$ (4:1) |
| Gas pressure: | 0.6 Pa |
| RF power: | 200 W |
| Substrate temperature: | 600° C. |
| Substrate: | (100)MgO, (110)$SrTiO_3$, sapphire |
| Layer thickness: | 3000 Å to 5000 Å |
| Annealing: | oxygen atmosphere at 900° C. for 1 hour after deposition |

The resulting $YBa_2Cu_3O_{7-\delta}$ layer 12 was patterned by a usual photolithography technique.

Then, yttrium fluoride was deposited over the $YBa_2Cu_3O_{7-\delta}$ layer 12 by electron beam (EB) evaporation. The deposited yttrium fluoride layer 13 had a thickness of 1000 Å.

To evaluate the yttrium fluoride layer as a protective layer, the following tests were conducted.

First, in the same manner as above, an oxide superconductor layer 12 of $YBa_2Cu_3O_{7-\delta}$ was formed on a substrate 11, but a passivation layer 13 of yttrium fluoride was not formed thereon. This substrate was immersed in liquid helium, and the electrical resistance of the oxide superconductor layer determined by a four probe method. The resulting resistance-temperature characteristic is shown in FIG. 2, as line A.

Then, a passivation layer 13 of yttrium fluoride was formed over the oxide superconductor layer 12 in the same manner as above. The thus-protected oxide superconductor layer on a substrate was immersed in warm water at 40° C. for 50 hours, and in a 1:1 aqueous solution of nitric acid (61%), chloric acid (36%) or fluoric acid (50%). After these immersions, the electrical resistance of the oxide superconductor layer was determined by the same method as above. The result of the case of the immersion in warm water at 40° C. for 50 hours is shown in FIG. 2 as line B.

FIG. 2 demonstrates that the property of the oxide superconductive layer was not significantly deteriorated by forming the passivation layer or by the immersion in warm water.

In the above example, similar results are obtained when yttrium is substituted by lanthanoids or when barium is substituted by strontium or calcium.

EXAMPLE 3

An oxide superconductor layer of $YBa_2Cu_3O_{7-\delta}$ having a thickness of 4000 Å was deposited on a sapphire substrate by RF magnetron sputtering and patterned, followed by forming a passivation layer of yttrium fluoride over the oxide superconductor layer having a thickness of 4000 Å by plasma CVD.

The protected superconductors formed in Examples 1 and 2 were immersed in 1:1 aqueous solutions of nitric, fluoric and chloric acids for 1 hour. After immersion, the protected oxide superconductor was observed by microscopy and scanning electron microscopy, and no damage by dissolution was found. IPC emission spectrophotometry was conducted on the solutions used for immersion and no element from the oxide superconductor was found therein.

In comparison, an oxide superconductor layer was formed on a substrate in the same manner as above and immersed in an aqueous acid solution. The oxide superconductor was completely dissolved after 15 to 30 seconds.

EXAMPLE 4

Refer to FIGS. 3A and 3B. The substrate 21 was formed of a single crystalline magnesia (MgO) and had a size of 20 mm square. A ground plane was formed over this substrate 21 by sputtering with multitargets.

Namely, a MgO substrate was mounted on an anode in a sputtering apparatus and sinters of $YBa_2Cu_3O_{7-\delta}$ and yttrium fluoride separately set to two targets, respectively. The apparatus was evacuated, while supplying $O_2$ and Ar at a ratio of 1:4, to a vacuum of $1\times10^{-2}$ Torr, and the substrate heated to 600° C. First, sputtering was effected with the target of $YBa_2Cu_3O_{7-\delta}$ to form a first wiring layer 22a having a thickness of 2000 Å, and then the supply of oxygen and heating of the substrate were stopped argon gas was supplied, and the apparatus evacuated to $1\times10^{-4}$ Torr. Sputtering the target of yttrium fluoride was then effected to form a first passivation layer 23 a having a thickness of 500 Å.

Then the formation of a wiring layer and formation of a passivation layer were alternately repeated in the same manner as described above, and thus a ground plane layer comprising first, second and third wiring layers 22a, 22b and 22c and first, second and third passivation layers 23a, 23b and 23c was formed.

The wiring of the ground plane layer was immersed in a 30% aqueous solution of nitric acid, and after about 1 hour, the third wiring layer 22c was broken due to dissolution of the third passivation layer 23c, but the second and first wiring layers 22a and 22b were not damaged and the wiring was still operable.

Thus, according to the present invention, an excellent protection against water and acids is provided and, therefore, an oxide superconductor having a high critical superconductivity temperature can be practically utilized because the oxide superconductor can be processed by a treatment using water or an acid.

What is claimed is:

1. An oxide superconductor comprising a substrate, a layer of an oxide superconductor, and an outermost layer of a fluoride, said layer of oxide superconductor being one selected from the group consisting of R—Ba—Cu—O system and R—(Sr or Ca)—Cu—O system superconductors wherein R represents yttrium, said fluoride being a fluoride of one or more elements selected from the group consisting of R, Ba and Cu when said oxide superconductor is R—Ba—Cu—O system superconductor and R, Sr, Ca and Cu when said oxide superconductor is R—(Sr or Ca)—Cu—O system superconductor.

2. An oxide superconductor according to claim 1, wherein said oxide superconductor is $YBa_2Cu_3O_{7-\delta}$, wherein $0 \leq \delta \leq 1$ and said fluoride is yttrium fluoride.

3. An oxide superconductor according to claim 1, wherein said oxide superconductor is ink the form of a layer formed on a substrate of magnesia and an exposed area of said layer of said oxide superconductor is covered by said layer of said fluoride.

4. An oxide superconductor according to claim 3, wherein said layer of said oxide superconductor forms a wiring layer.

5. An oxide superconductor according to claim 1, wherein said fluoride layer has a thickness of 100 to 2000 Å.

6. An oxide superconductor according to claim 1 wherein said fluoride is a rare earth metal fluoride.

7. An oxide superconductor according to claim 1 wherein said fluoride is yttrium fluoride.

8. An oxide superconductor according to claim 1, having a resistivity at 90 K of greater than 0.5 mΩ-cm.

9. An oxide superconductor according to claim 1, wherein the substrate is selected from the group consisting of magnesia, strontium titanate and sapphire.

10. A superconductor wiring comprising: a substrate and a plurality of alternate layers of an oxide superconductor and a fluoride formed on said substrate, an outermost layer being a fluoride layer, so that each of said oxide superconductor layers is covered with said fluoride layer, said oxide superconductor layers as a whole constituting a wiring pattern, said oxide superconductor being one selected from the group consisting of R—Ba—Cu—O system and R—(Sr or Ca)—Cu—O system superconductors wherein R represents yttrium, said fluoride being a fluoride of one or more elements selected from the group consisting of R, Ba and Cu when said oxide superconductor is R—Ba—Cu—O system superconductor and R, Sr, Ca and Cu when said oxide superconductor is R—(Sr or Ca)—Cu—O system superconductor.

11. A superconductor wiring according to claim 10, wherein said oxide superconductor is $YBa_2Cu_3O_{7-\delta}$, wherein $0 \leq \delta 1$ and said fluoride is yttrium fluoride.

12. A superconductor wiring according to claim 10, wherein said oxide superconductor is in the form of a layer formed on a substrate and an exposed area of said layer of said oxide superconductor is covered by said layer of said fluoride.

13. A superconductor wiring according to claim 12, wherein said layer of said oxide superconductor forms a wiring layer.

14. A superconductor wiring according to claim 10, wherein said fluoride layers have a thickness of 100 to 2000 Å.

15. An oxide superconductor according to claim 10, having a resistivity at 90K of greater than 0.5 mΩ-cm.

16. An oxide superconductor according to claim 10, wherein the substrate is selected from the group consisting of magnesia, strontium titanate and sapphire.

17. An oxide superconductor comprising a substrate, a layer of an oxide superconductor, and an outermost layer of a fluoride, said layer of oxide superconductor being one selected from the group consisting of R—Ba—Cu—O system and R—(Sr or Ca)—Cu—O system superconductors wherein R represents lanthanoids except for Ce and Pr, said fluoride being a fluoride of one or more elements selected from the group consisting of R, Ba and Cu when said oxide superconductor is R—Ba—Cu—O system superconductor and R, Sr, Ca and Cu when said oxide superconductor is R—(Sr or Ca)—Cu—O system superconductor.

18. An oxide superconductor according to claim 17, wherein the substrate is selected from the group consisting of magnesia, strontium titanate and sapphire.

19. A superconductor wiring comprising: a substrate and a plurality of alternate layers of an oxide superconductor and a fluoride formed on said substrate, an outermost layer being a fluoride layer, so that each of said oxide superconductor layers is covered with said fluoride layer, said oxide superconductor layers as a whole constituting a wiring pattern, said oxide superconductor being one selected from the group consisting of R—Ba—Cu—O system and R—(SR or Ca)—Cu—O system superconductors wherein R represents lanthanoids except for Ce and Pr, said fluoride being a fluoride of one or more elements selected from the group consisting of R, Ba and Cu when said oxide superconductor is R—Ba—Cu—O system superconductor and R, Sr, Ca and Cu when said oxide superconductor is R—(Sr or Ca)—Cu—O system superconductor.

20. An oxide superconductor according to claim 19, wherein the substrate is selected from the group consisting of magnesia, strontium titanate and sapphire.

* * * * *